United States Patent
Yap

(10) Patent No.: US 9,786,515 B1
(45) Date of Patent: Oct. 10, 2017

(54) SEMICONDUCTOR DEVICE PACKAGE AND METHODS OF MANUFACTURE THEREOF

(71) Applicant: FREESCALE SEMICONDUCTOR, INC., Austin, TX (US)

(72) Inventor: Weng Foong Yap, Chandler, AZ (US)

(73) Assignee: NXP USA, INC., Austin, TX (US)

( * ) Notice: Subject to any disclaimer, the term of this patent is extended or adjusted under 35 U.S.C. 154(b) by 0 days.

(21) Appl. No.: 15/170,254

(22) Filed: Jun. 1, 2016

(51) Int. Cl.
| | |
|---|---|
| *H01L 21/48* | (2006.01) |
| *H01L 21/56* | (2006.01) |
| *H01L 23/00* | (2006.01) |
| *H01L 23/498* | (2006.01) |
| *H01L 25/10* | (2006.01) |

(52) U.S. Cl.
CPC ........ *H01L 21/4846* (2013.01); *H01L 21/481* (2013.01); *H01L 21/568* (2013.01); *H01L 23/49805* (2013.01); *H01L 23/49838* (2013.01); *H01L 24/03* (2013.01); *H01L 24/13* (2013.01); *H01L 25/105* (2013.01); *H01L 2224/02311* (2013.01); *H01L 2224/02331* (2013.01); *H01L 2224/02381* (2013.01); *H01L 2224/13008* (2013.01); *H01L 2224/13024* (2013.01); *H01L 2225/107* (2013.01); *H01L 2225/1041* (2013.01); *H01L 2225/1058* (2013.01)

(58) Field of Classification Search
CPC ........... H01L 21/4846; H01L 23/49805; H01L 23/49838; H01L 24/03; H01L 21/568; H01L 24/13; H01L 25/105; H01L 21/481; H01L 2224/13008; H01L 2225/1041; H01L 2224/13024; H01L 2224/02381; H01L 2225/1058; H01L 2224/02331
See application file for complete search history.

(56) References Cited

U.S. PATENT DOCUMENTS

| | | | |
|---|---|---|---|
| 6,335,491 | B1 | 1/2002 | Alagaratnam et al. |
| 7,994,626 | B2 | 8/2011 | Pendse |
| 8,222,538 | B1 | 7/2012 | Yoshida et al. |
| 8,557,629 | B1 | 10/2013 | Kim et al. |
| 2005/0121769 | A1 | 6/2005 | Watts et al. |
| 2010/0038764 | A1 | 2/2010 | Lyne |
| 2013/0049217 | A1 | 2/2013 | Gong et al. |
| 2013/0154091 | A1* | 6/2013 | Wright ............. H01L 23/49816 257/738 |

* cited by examiner

*Primary Examiner* — Kyoung Lee

(57) ABSTRACT

A semiconductor device package and method of manufacturing is provided. An interconnect pre-assembly includes a first frame having a plurality of first signal conduits affixed to a second frame having a plurality of second signal conduits embedded in a second substrate forming an electrical coupling between one or more first signal conduits and one or more of the second signal conduits. One or more conductive balls are connected to the one or more second signal conduits. The interconnect pre-assembly is placed over a semiconductor die, having at least one of the first conductive balls disposed over the semiconductor die. An encapsulant encapsulates the interconnect pre-assembly, the semiconductor die, and the one or more conductive balls, such that a portion of the one or more first conductive balls is exposed at a top surface of the encapsulant.

20 Claims, 9 Drawing Sheets

SEMICONDUCTOR DEVICE PACKAGE AND METHODS OF MANUFACTURE THEREOF

BACKGROUND

Field

This disclosure relates generally to semiconductor device packaging, and more specifically, to semiconductor device packaging using a substrate pre-place via.

Related Art

Packaged semiconductor devices are often found in a large spectrum of electronic products—from sewing machines to washing machines, from automobiles to cellular telephones, and so on. These packaged semiconductor devices are typically mounted on a substrate such as a printed circuit board. In order to keep product costs low or to reduce product costs, it is common to minimize the amount of material used within the product, frequently reducing the size of the product itself. As electronic products are reduced in size, printed circuit board real estate becomes more precious putting additional constraints on the size, number, and features of packaged semiconductor devices— finer pin pitch, higher integration, package-on-package arrangements, and so on.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Generally, there is provided, a semiconductor device package and method of manufacturing that incorporates a substrate pre-place via assembly which allows for higher I/O count in package-on-package configurations. Interconnect in a multi-layer substrate provides conductive paths to electrical contacts or couplings on a top side of a semiconductor device package, including areas typically devoid of contacts because of underlying semiconductor die, without increasing the semiconductor device package footprint or adding significant cost or process steps. Providing higher I/O count including electrical contacts in virtually all areas on the top side surface of a semiconductor package without a complex buildup process allows for a thinner package for the semiconductor device and, ultimately, a thinner package-on-package stack.

Figure 1:
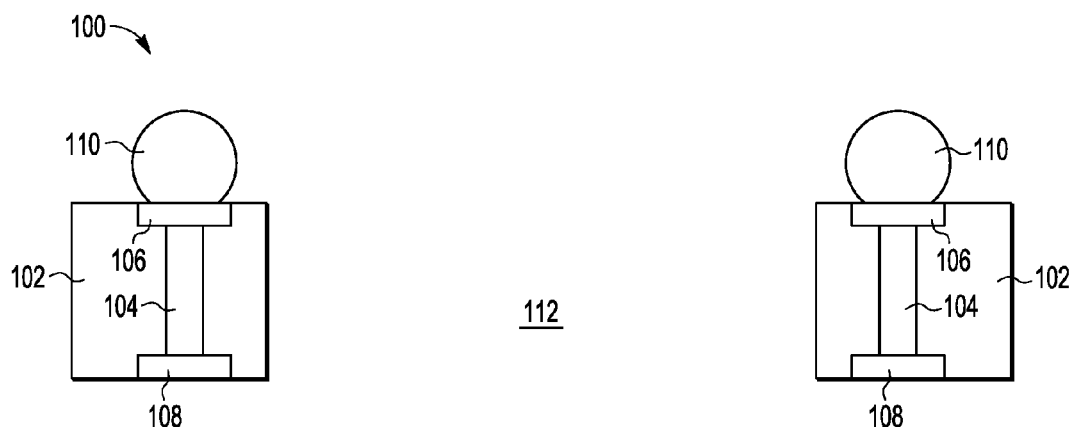
FIGS. 1-5 illustrate, in a simplified cross-sectional view, stages of manufacture of a stacked pre-assembly structure according to an embodiment of the present disclosure.

FIG. 1 illustrates, in a simplified cross-sectional view, a stage of manufacture of stacked pre-assembly structure, including a first substrate pre-place via (sPPV) frame 100 according to an embodiment of the present disclosure. The first sPPV frame includes a first substrate 102 having interconnect that includes first signal conduits 104 and interconnect or routing layers 106 and 108. Conductive connectors 110 are electrically coupled to interconnect layer 106. In this embodiment, conductive connectors 110 may also be referred to as ball connectors 110. In one embodiment, ball connectors 110 are solder balls. Conductive connectors 110 may also be referred to as ball conductors, being formed of one or more conductive materials. Alternatively, conductive connectors 110 may be any suitable conductive structure such as gold studs, copper pillars, to electrically connect conductive features of sPPV frame 100 with another frame, for example.

Substrate 102 may include any suitable non-conductive material such as ceramic, FR-4, or organic bulk materials (e.g., standard printed circuit board (PCB) materials). Substrate 102 may be formed in a variety of shapes such as strips, rectangles, and squares, for example. In this embodiment, substrate 102 is formed as a square shape having an opening 112 in the inner portion of the square. Accordingly, signal conduits 104 can be arranged around the outer portion of the square.

Signal conduits 104 can be attached to or formed in the substrate 102 through any suitable process such as sputtering, deposition, plating, and the like, for example. Signal conduits 104 allow for signal communication from a top side surface of substrate 102 to a bottom side surface of substrate 102. Signal conduits 104 can be formed from a variety of electrically conductive materials including, for example, copper, gold, silver, aluminum, nickel, tungsten, and alloys thereof to include solder, doped materials (e.g., phosphorus, boron-doped polysilicon), superconducting materials and ceramics (e.g., copper oxide materials, iron-based materials, and other metallic-based materials. Signal conduits 104 could also be formed of more than one type of material depending on the process to create the conduits, assembly and particular package structures.

Interconnect layers 106 and 108 may be formed of any suitable conductive material, such as copper, aluminum, and alloys thereof, for example. Interconnect layers 106 and 108 can provide connection or bonding sites for connecting ball connectors 110, gold studs, copper pillars, and the like. Interconnect layers 106 and 108 can also provide electrical connections between ball connectors 110.

Figure 2:
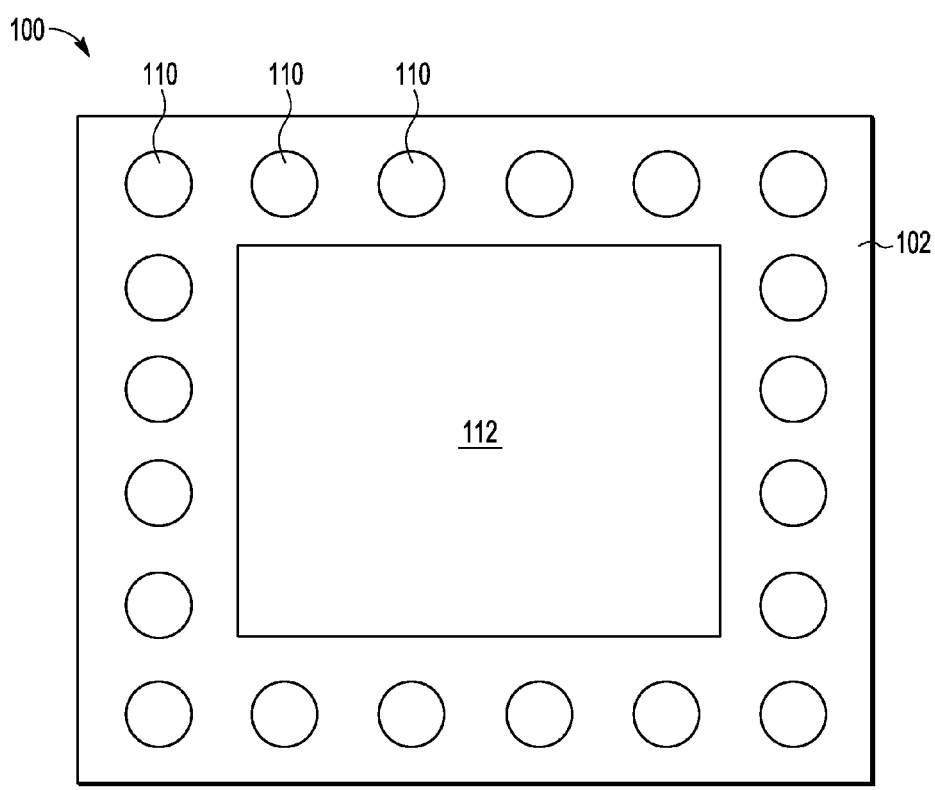

FIG. 2 illustrates, in a simplified plan view, a stage of manufacture of stacked pre-assembly structure 100, including the first sPPV frame 100 according to an embodiment of the present disclosure shown in FIG. 1. Substrate 102 is shown in an exemplary square configuration with opening 112 in the inner portion of the square. Ball connectors 110 are shown arranged around the outer portion of the square. It should be understood that embodiments of the present disclosure are not limited to a particular shape or configuration of the substrate. Alternative shapes and configurations such as strips, rectangles, octagons, circles, and other orthogonal or non-orthogonal shapes may be desirable. Embodiments of the substrate include conductors that allow for signal communication from a top side surface of the first sPPV frame to a bottom side surface of the first sPPV frame. Ball connectors 110 are affixed to the substrate such that ball connectors 110 are electrically coupled to signal conduits 104 and interconnect layer 106 (not shown).

Figure 3:
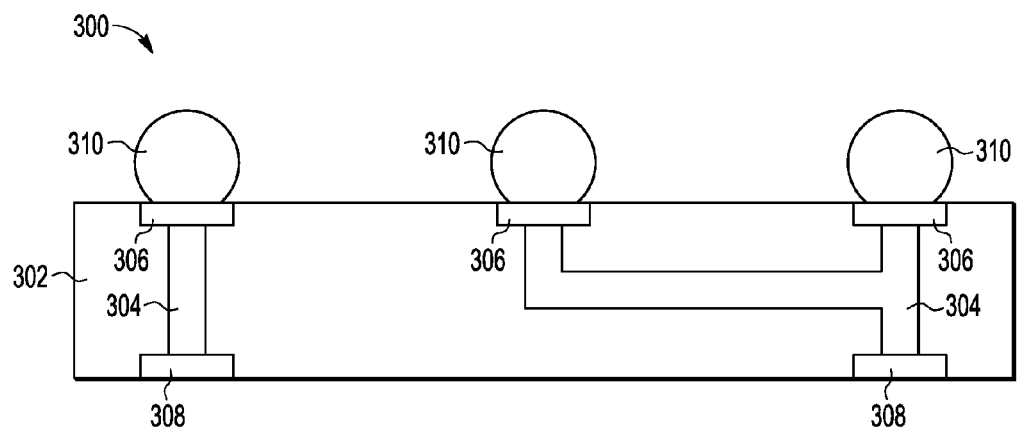

FIG. 3 illustrates, in a simplified cross-sectional view, another stage of manufacture of stacked pre-assembly structure, including a second substrate pre-place via (sPPV) frame 300 according to an embodiment of the present disclosure. The second sPPV frame 300 includes a second substrate 302 having multi-layer interconnect that includes second signal conduits 304 and interconnect or routing layers 306 and 308. The second sPPV 300 may include several interconnect layers. Conductive ball connectors 310 are electrically coupled to interconnect layer 306. In one embodiment, ball connectors 310 are solder balls. Ball connectors 310 may also be referred to as ball conductors, being formed of one or more conductive materials. Ball connectors 310 may be formed of similar materials as ball connectors 110 shown in FIG. 1. In some embodiments, ball connectors 310 may be formed of materials different from ball connectors 110 shown in FIG. 1.

Substrate 302 may include any suitable multi-layer substrate, formed of non-conductive material such as ceramic or organic bulk materials (e.g., multi-layer laminate printed circuit board (PCB) materials). Substrate 302 may be formed in a variety of shapes such as strips, rectangles, squares, other orthogonal and non-orthogonal shapes for example, depending upon package layout and configuration. Substrate 302 is formed in a shape and configured such that conductive sites on the bottom surface of substrate 302 can be mated with ball connectors 110 of FIGS. 1 and 2.

Signal conduits 304 can be attached to or formed in the substrate 302 through any suitable process such as sputtering, deposition, and plating, for example. Signal conduits 304 allow for signal communication from a top side surface of substrate 302 at interconnect layer 306 to a bottom side surface of substrate 302 at interconnect layer 308, for example. Signal conduits 304 can be formed from a variety of electrically conductive materials including, for example, copper, gold, silver, aluminum, nickel, tungsten, and alloys thereof to include solder, doped materials (e.g., phosphorus, boron-doped polysilicon), superconducting materials and ceramics (e.g., copper oxide materials, iron-based materials, and other suitable metallic-based materials. Signal conduits 304 could also be formed of more than one type of material depending on the process to create the conduits, assembly and particular package structures.

Interconnect layers 306 and 308 may be formed of any suitable conductive material, such as copper, nickel, aluminum, and alloys thereof, for example. Interconnect layers 306 and 308 can provide connection or bonding sites for connecting ball connectors 310. Interconnect layers 306 and 308 can also provide electrical connections between ball connectors 310, for example.

Figure 4:
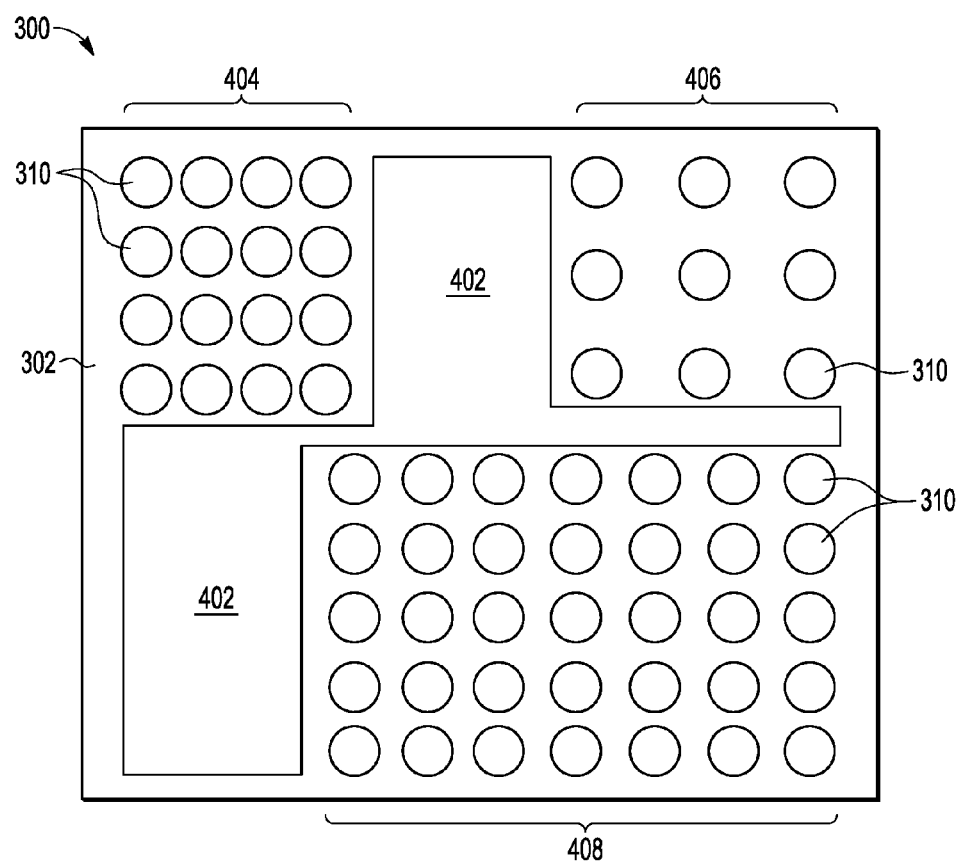

FIG. 4 illustrates, in a simplified plan view, a stage of manufacture of stacked pre-assembly structure, including the second sPPV frame 300 according to an embodiment of the present disclosure shown in FIG. 3. Substrate 302 is shown in an exemplary square configuration with a populated arrangement of ball connectors 310 and unpopulated regions 402 within the square. It should be understood that embodiments of the present disclosure are not limited to a particular shape or configuration of the substrate. Alternative shapes and configurations such as rectangles, squares, octagons, circles, and other orthogonal or non-orthogonal shapes may be desirable. Embodiments of the substrate include conductors that allow for signal communication from a top side surface of the second sPPV frame 300 to a bottom side surface of the second sPPV frame 300. Even though conductive sites (e.g., interconnect layer 308) on the bottom surface of substrate 302 can be mated with ball connectors 110, interconnect layer 306 can provide connection or bonding sites for connecting ball connectors 310 virtually anywhere on the top surface of substrate 302, particularly including the portion of the substrate 302 coincident with the opening 112 of first substrate 102 when mated.

Ball connectors 310 are affixed to the substrate such that ball connectors 310 are electrically coupled to interconnect layer 306 (not shown). Substrate 302 may be configured such that arrays or groupings (404-408) of ball connectors 310 may be arranged in one or more layout pitches. For example, substrate 302 may be configured with a first array 404 of ball connectors 310 arranged at a 0.4 mm pitch, a second array 408 arranged at a 0.5 mm pitch, and a third array 406 arranged at a 0.65 mm pitch. It should be understood that embodiments of the present disclosure are not limited to a particular size, pitch, or arrangement of ball connectors 310. Such example groupings (404-408) of ball connectors 310 illustrate that one or more other device packages have different connector pitches can be affixed to the top surface of substrate 302, overlapping the opening 112 of first substrate 102 when mated. The unpopulated region(s) of the substrate allow for mold compound flow during an encapsulation stage of package manufacture.

Figure 5:
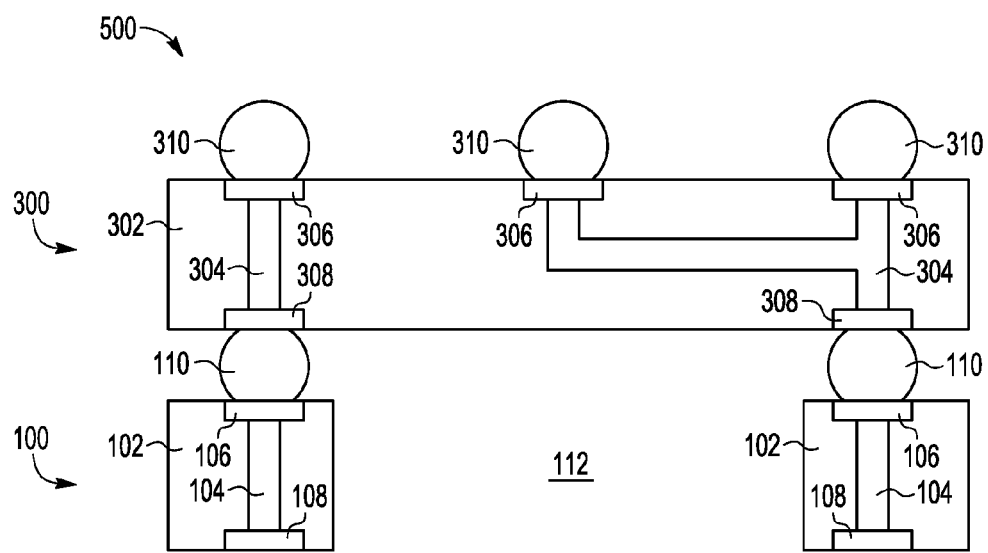

FIG. 5 illustrates, in a simplified cross-sectional view, a stage of manufacture of an exemplary stacked pre-assembly structure 500, including first sPPV frame 100 and second sPPV frame 300 according to an embodiment of the present disclosure. The first sPPV frame 100 and the second sPPV frame 300 may each be formed or manufactured independently. The first sPPV frame 100 and the second sPPV frame 300 are affixed to one another forming stacked pre-assembly structure 500. The stacked pre-assembly structure 500 electrically couples respective second signal conduits 304 with first signal conduits 104. Ball connectors 110 are in a configuration that matches interconnect layer 308 of second sPPV frame 300. Conductive surfaces of interconnect layer 308 and ball connectors 110 can be affixed to one another using known techniques such as solder reflow and the like, for example. With using a technique such as solder reflow, the entire stacked pre-assembly structure 500 may be subjected to temperatures sufficient to melt or reflow solder, solder paste, and the like. For example, the materials used in the stacked pre-assembly structure 500 should be capable of withstanding temperatures such as at least 260 C. With the second sPPV frame 300 affixed to the first sPPV frame 100, the opening 112 forms a cavity in the stacked pre-assembly structure 500 allowing placement of the stacked pre-assembly structure 500 over a semiconductor die, for example. Accordingly, the example groupings (404-408) of ball connectors 310 in FIG. 4 illustrate that one or more other device packages can be affixed to the top surface of substrate 302, overlapping the opening 112.

Figure 6:
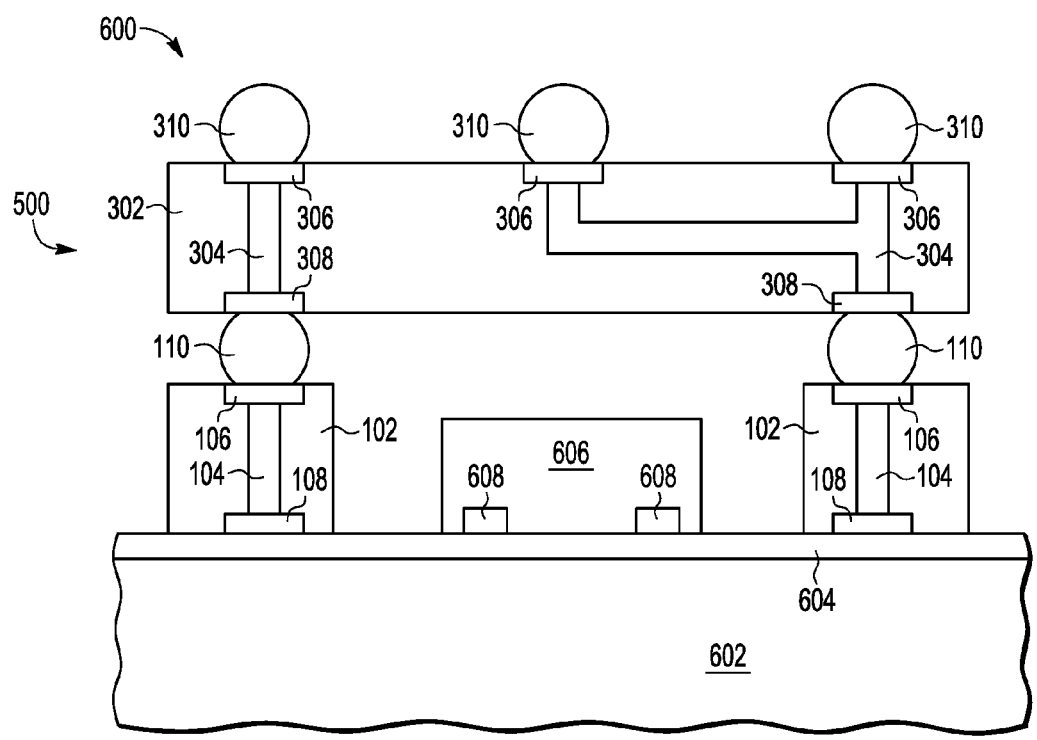
FIGS. 6-9 illustrate, in a simplified cross-sectional view, stages of manufacture of a packaged semiconductor device according to an embodiment of the present disclosure.

FIG. 6 illustrates, in a simplified cross-sectional view, a stage of manufacture of a packaged semiconductor device 600, including pre-assembly structure 500, according to an embodiment of the present disclosure. A semiconductor die 606 is placed active surface face down in a first area on an adhesive layer 604 on a carrier 602. The active surface of semiconductor die 606 is a major surface of the die having bond pads 608, for example. The stacked pre-assembly structure 500 is placed in a second area on adhesive layer 604 on the carrier 602 such that the cavity formed by opening 112 accommodates semiconductor die 606. For example, the second area where substrate 102 of the stacked pre-assembly structure 500 is on adhesive layer 604 substantially surrounds the first area where semiconductor die 606 is on the adhesive layer 604. Accordingly, the example groupings (404-408) of ball connectors 310 in FIG. 4 illustrate that one or more other device packages can be affixed to the top surface of substrate 302, for example, having at least one or more of the ball connectors 310 placed over the semiconductor die 606. In some embodiments, the cavity formed by opening 112 accommodates multiple die and/or electronic components.

Adhesive layer 604 can be of a standard type used in semiconductor packaging processing including, for example, a double-sided polyimide sticky tape having a silicone adhesive on both sides. The adhesive layer should be of a type that can withstand the packaging processing without becoming brittle or permanently fixed in place, since at a later point in processing the adhesive layer will be separated from the package.

Figure 7:
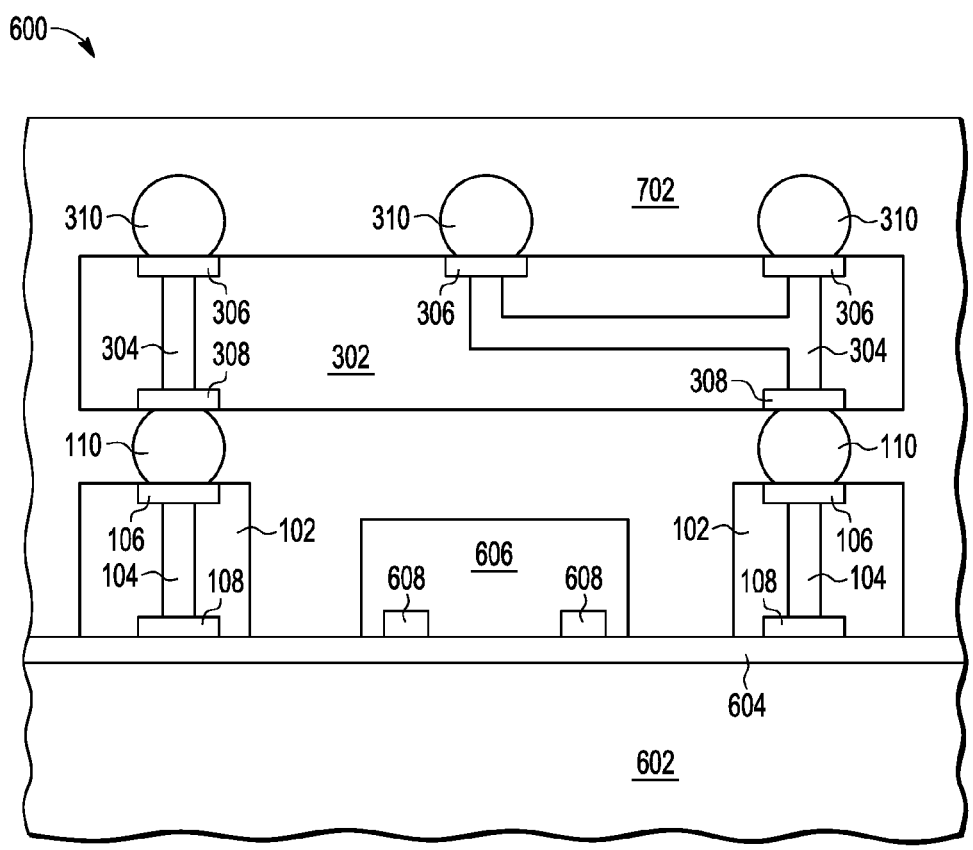

FIG. 7 illustrates, in a simplified cross-sectional view, a subsequent stage of manufacture of packaged semiconductor device 600, including encapsulated pre-assembly structure 500 and semiconductor die 606 according to an embodiment of the present disclosure. A mold compound material is applied to the structures affixed to adhesive layer 604 (e.g., pre-assembly structure 500 and semiconductor die 606), forming an encapsulant 702 that encapsulates the structures within the mold compound material, and formed into an encapsulated panel. A panel may typically include several semiconductor devices (600) arranged in an array. The mold compound material can be any suitable encapsulant including, for example, silica-filled epoxy molding compounds, plastic encapsulation resins, and other polymeric materials such as silicones, polyimides, phenolics, and polyurethanes. The mold compound material can be applied by a variety of standard processing techniques used in encapsulation including, for example, printing, compression molding and spin application. Once the mold compound material is applied, the encapsulated panel can be cured by exposing the materials to certain temperatures for a period of time, or by applying curing agents, or both.

Figure 8:
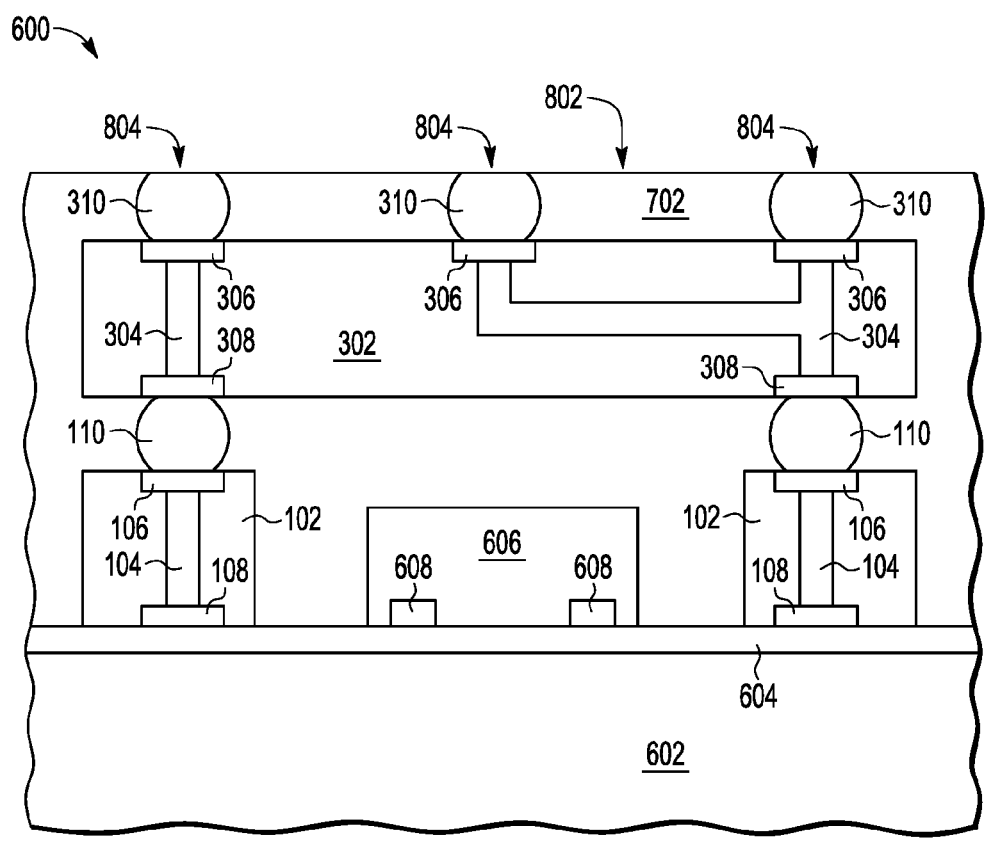

FIG. 8 illustrates, in a simplified cross-sectional view, a subsequent stage of manufacture of packaged semiconductor device 600, including encapsulated pre-assembly structure 500 and semiconductor die 606 according to an embodiment of the present disclosure. Encapsulant 702 is reduced in thickness to expose a portion of ball connectors 310. This reduction in thickness of the encapsulant and exposing of the ends of the signal conduits can be performed by conventional techniques, such as a grinding, lapping or polishing process, for example. The reduction in thickness process exposes a top surface 802 of the encapsulant, as well as top conductive surfaces 804 of ball connectors 310. As will be appreciated, as the reduction in thickness process is performed down to the middle of the ball connectors, the area of top conductive surfaces 804 increases. For example, a predetermined depth of the reduction in thickness process (e.g., grinding) can be determined by the type of the connectors that will be in contact with top conductive surfaces 804, such as in a stacked package-on-package configuration and the like.

Figure 9:
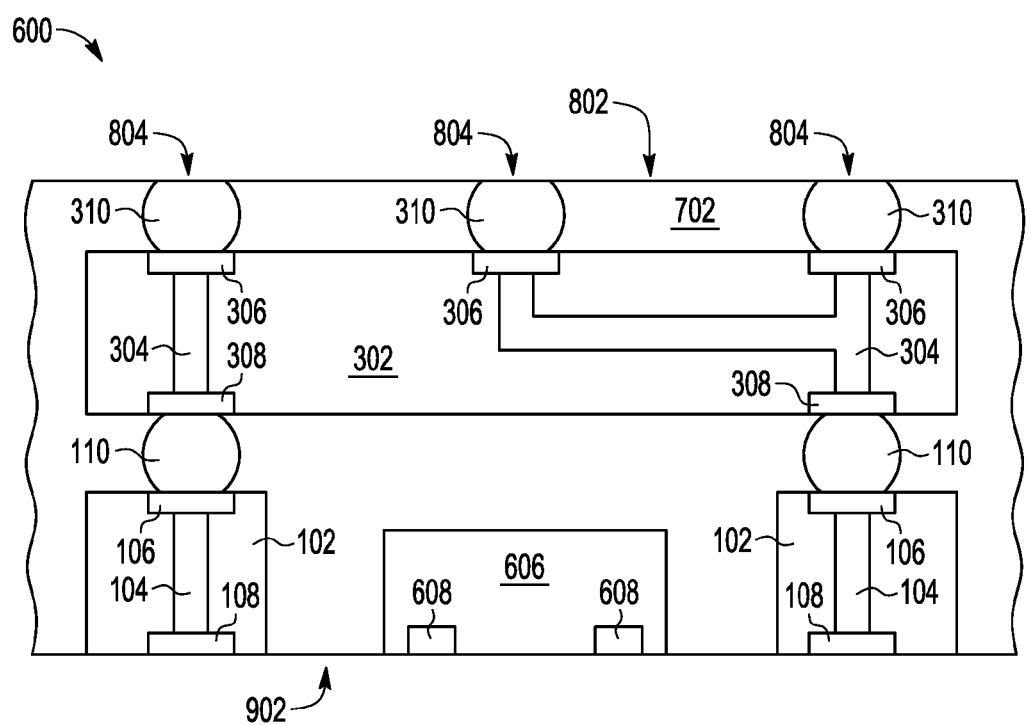

FIG. 9 illustrates, in a simplified cross-sectional view, a subsequent stage of manufacture of packaged semiconductor device 600, including encapsulated pre-assembly structure 500 and semiconductor die 606 according to an embodiment of the present disclosure. The encapsulated panel is removed from adhesive layer 604 (and carrier 602). Once released from the adhesive layer 604, the exposed surface 902 of the encapsulated panel previously attached to the adhesive layer 604 can be cleaned to remove any excess adhesive remaining attached to the encapsulated panel. This process of release and clean exposes conductive surfaces on the bottom side of the encapsulated panel, including interconnect layer 108 and bond pads 608. At this stage of manufacture, it can be realized that signal conduits 104 and 304, with ball connectors 110 and 310, form conductive pathways, or through vias, between the top and bottom surfaces (802 and 902) of the encapsulated panel. These conductive pathways can be used, for example, to enable electrical connection between interconnect structures or pads formed on the bottom of a package formed from the panel and top connectors formed from conductive surfaces 320.

Figure 10:
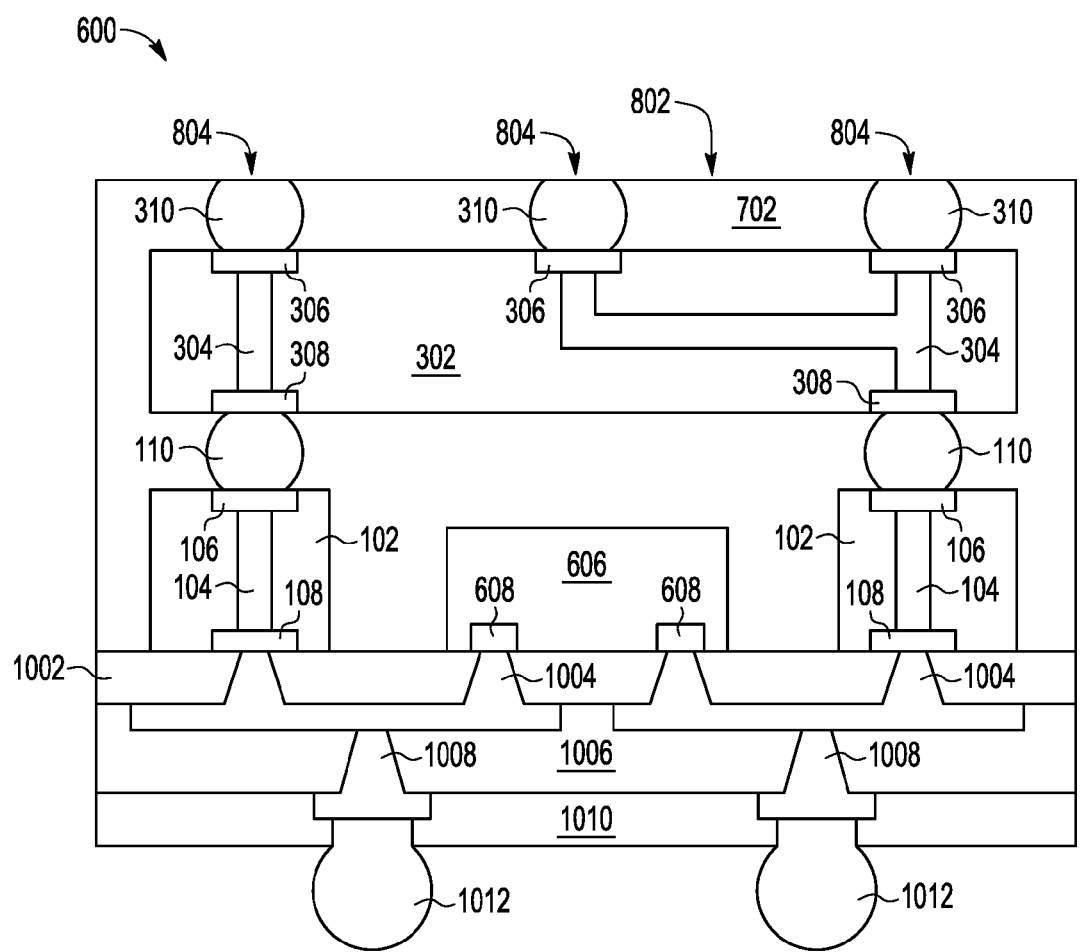
FIG. 10 illustrates, in a simplified cross-sectional view, a stage of manufacture of a packaged semiconductor device, including a bottom side build up according to an embodiment of the present disclosure.

FIG. 10 illustrates, in a simplified cross-sectional view, a subsequent stage of manufacture of packaged semiconductor device 600, including bottom side buildup, ball placement and singulation according to an embodiment of the present disclosure. Using known techniques, methods, and processes, an insulating layer 1002 can be deposited or applied over the exposed surface 902 of the encapsulated panel including the encapsulated die 606, bond pads 608, interconnect layer 108 and encapsulation mold compound material 702. Insulating layer 1002 can be made from polyimide and organic polymers, for example, in liquid or dry film and can include a wide range of other materials used for interlayer dielectrics as known in the art (e.g., silicon dioxide, silicon nitride, silicon oxynitride, or any combination of such layers providing electrical isolation). Insulating layer 1002 can be patterned to expose bonding pads 608, as well as the interconnect layer 108.

A conductive layer 1004 can then be deposited to provide an interconnect between the bonding pads 608 and interconnect layer 108. Conductive layer 1004 can include materials such as metal, metal alloy, doped semiconductor, semimetals, or combinations thereof as known in the art (e.g., amorphous silicon, doped polysilicon, aluminum, copper, silver, gold, tantalum, titanium, tungsten, or any metal alloy, nitride or silicide). Through the use of conductive layer 1004, any number of bonding pads 608 can be interconnected in any combination to the same die or other die and to the vias formed in insulating layer 1002 by electrically conductive signal conduits. The interconnect illustrated in FIG. 10 is provided only by way of example, and it should be realized that the interconnects formed by conductive layer 1004 and other conductive layers discussed below can extend not only across the page as illustrated but also into and above the page.

An additional interconnect layer can be provided by forming additional insulating layers (e.g., insulating layer 1006) and patterning those insulating layers with vias to receive additional conductive layers (e.g., conductive layer 1008). The range of materials that can be used for subsequent insulating layers and conductive layers can include those listed for insulating layer 1002 and conductive layer 1004, and each type of layer can be the same or different materials. Further, as illustrated, conductive ball connectors 1012 can be provided by forming insulating layer 1010, patterning that layer to expose pads formed in conductive layer 1008, and forming and placing conductive balls 1012 using known techniques and materials.

At this stage of manufacture, it can be realized that packaged semiconductor device 600 is formed in which conductive features are provided on the top side of the package and bottom side of the package. Conductive pathways formed between the top side conductive surfaces 804 and bottom side ball connectors 1012 include signal conduits 104 and 304, with ball connectors 110 and 310, and bottom side interconnect layers 1004 and 1008. These conductive pathways can be used, for example, to enable electrical connection between the top side conductive surfaces 804 and bottom side ball connectors 1012, between the top side conductive surfaces 804 and bond pads 608, and between bottom side ball connectors 1012 and bond pads 608. An advantage of forming conductive pathways in accordance with embodiments of the present disclosure is that one or more other packaged devices may be directly attached to the top side conductive surfaces 804 while staying within the approximate footprint or perimeter of packaged semiconductor device 600.

Figure 11:
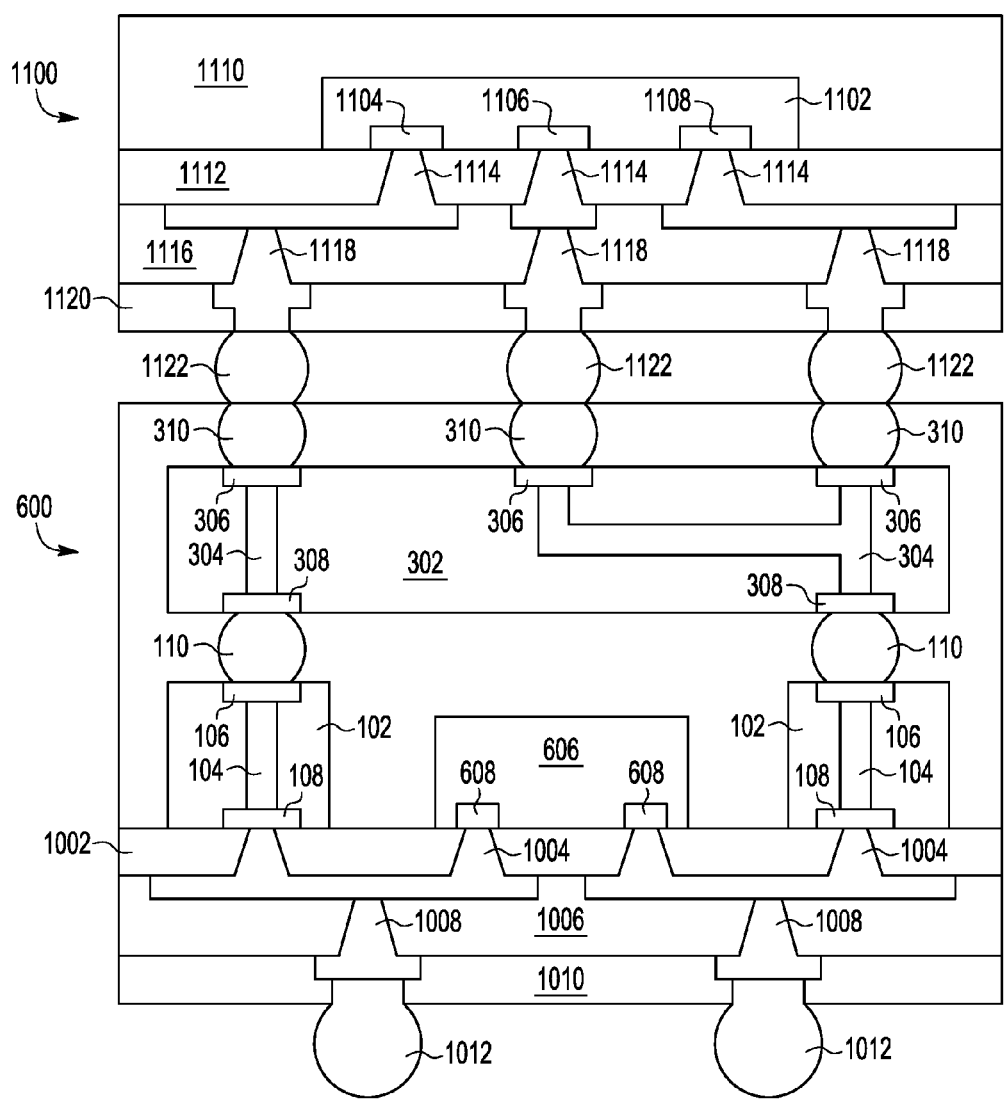
FIG. 11 illustrates, in a simplified cross-sectional view, a stage of manufacture of a packaged semiconductor device, including a top side coupled packaged device according to an embodiment of the present disclosure.

FIG. 11 illustrates, in a simplified cross-sectional view, packaged semiconductor device 600 electrically coupled to a packaged device 1100 using the top conductive surfaces 804 according to an embodiment of the present disclosure. Packaged device 1100 includes a die 1102 with bond pads 1104-1108. Die 1102 is encapsulated in an encapsulant 1110. An interconnect is formed on the bottom side of packaged device 1100. An insulating layer 1112 is formed over the bottom surface of encapsulated die 1102 and encapsulation mold compound material 1110. Insulating layer 1112 can be patterned to expose bond pads 1104-1108. A conductive layer 1114 is formed to provide an interconnect from the bond pads 1104-1108. Again, the interconnect illustrated in FIG. 11 is provided only by way of example, and it should be realized that the interconnect formed by conductive layer 1114 and other conductive layers discussed below can extend not only across the page as illustrated but also into and above the page.

An additional interconnect layer can be provided by forming additional insulating layers (e.g., insulating layer 1116) and patterning those insulating layers to receive additional conductive layers (e.g., conductive layer 1118). Further, as illustrated, a set of conductive ball connectors can be provided by forming insulating layer 1120, patterning that layer to expose pads formed in conductive layer 1118, and forming and placing conductive balls 1122 using known techniques and materials. The range of materials that can be used for the insulating layers and conductive layers of packaged device 1100 can include those listed for insulating layer 1002 and conductive layer 1004 of packaged semiconductor device 600, and each type of layer can be of the same or different materials as desired.

Conductive balls connectors 1122 are formed in a configuration that matches one or more of the top conductive surfaces 804 of packaged semiconductor device 600. The conductive ball connectors 1122 and the conductive surfaces 804 can be affixed to one another using known techniques and methods such as solder reflow and the like. Embodiments of the present disclosure are not limited to coupling a package to the top conductive surfaces 804. For example, discrete components, heat sinks, or shields can be solder coupled to the top conductive surfaces 804.

Figure 12:
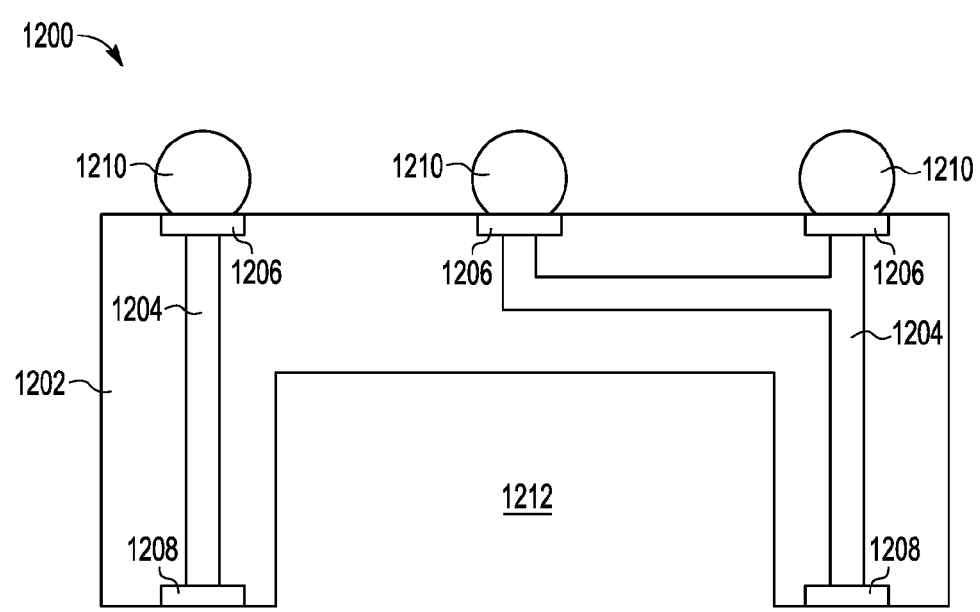
FIG. 12 illustrates, in a simplified cross-sectional view, a stage of manufacture of an alternative pre-assembly structure according to an embodiment of the present disclosure.

FIG. 12 illustrates, in a simplified cross-sectional view, a stage of manufacture of an alternative pre-assembly structure, including a substrate pre-place via (sPPV) frame 1200 according to an embodiment of the present disclosure. Subsequent stages of manufacture of an exemplary embodiment can be realized by replacing the stacked pre-assembly structure (500) in FIGS. 6-11 with alternative pre-assembly structure 1200. The sPPV frame 1200 includes a substrate 1202 having multi-layer interconnect that includes signal conduits 1204 and interconnect or routing layers 1206 and 1208. The sPPV frame 1200 may include several interconnect layers. Conductive ball connectors 1210 are electrically coupled to interconnect layer 1206. In one embodiment, ball connectors 1210 are solder balls. Ball connectors 1210 may also be referred to as ball conductors, being formed of one or more conductive materials.

Substrate 1202 may include any suitable multi-layer substrate, formed of non-conductive material such as ceramic or organic bulk materials (e.g., multi-layer laminate printed circuit board (PCB) materials). Substrate 1202 may be formed in a variety of shapes such as strips, rectangles, squares, other orthogonal and non-orthogonal shapes for example, depending upon package layout and configuration. Substrate 1202 includes a recessed portion 1212 which may be formed as a cavity in substrate 1202. Signal conduits 1204 can be attached to or formed in the substrate 1202 through any suitable process such as sputtering, deposition, and plating, for example.

Signal conduits 1204 allow for signal communication from a top side surface of substrate 1202 at interconnect layer 1206 to a bottom side surface of substrate 1202 at interconnect layer 1208, for example. Signal conduits 1204 can be formed from a variety of electrically conductive materials including, for example, copper, gold, silver, aluminum, nickel, tungsten, and alloys thereof to include solder, doped materials (e.g., phosphorus, boron-doped polysilicon), superconducting materials and ceramics (e.g., copper oxide materials, iron-based materials, and other suitable metallic-based materials. Signal conduits 1204 could also be formed of more than one type of material depending on the process to create the conduits, assembly and particular package structures.

Interconnect layers 1206 and 1208 may be formed of any suitable conductive material, such as copper, nickel, aluminum, and alloys thereof, for example. Interconnect layers 1206 and 1208 can provide connection or bonding sites for conductive ball connectors 1210, for example. Interconnect layers 1206 and 1208 can also provide electrical connections between ball connectors 1210. Interconnect layers 1206 and 1208 with ball connectors 1210 allow for connections to be formed over recessed portion 1212.

Ball connectors 1210 are in a configuration that matches one or more other device packages that may be mounted to a top surface of the semiconductor device package. Conductive surfaces of interconnect layer 1206 and ball connectors 1210 can be affixed to one another using known techniques such as solder reflow and the like, for example. In using a technique such as solder reflow, the pre-assembly structure 1200 may be subjected to temperatures sufficient to melt or reflow solder, solder paste, and the like. For example, the materials used in the pre-assembly structure 1200 should be capable of withstanding temperatures such as at least 260 C. The recessed portion 1212 forms a cavity in the pre-assembly structure 1200 allowing placement of the pre-assembly structure 1200 over a semiconductor die, for example.

By now it should be appreciated that a semiconductor device package and method for manufacturing have been provided which allows for one or more other packages to be affixed at a top surface without increasing the overall footprint of the semiconductor device package. A substrate pre-place via assembly allows for higher I/O count in such package-on-package configurations. Interconnect in a multi-layer substrate provides conductive paths to electrical contacts or couplings on a top side of a semiconductor device package, including areas typically devoid of contacts because of underlying semiconductor die, without increasing the semiconductor device package footprint or adding significant cost or process steps. Providing higher I/O count including electrical contacts in virtually all areas on the top side surface of a semiconductor package without a complex buildup process allows for a thinner package for the semiconductor device and, ultimately, a thinner package-on-package stack.

Generally, there is provided, a method of manufacturing a packaged semiconductor device including providing a stacked interconnect pre-assembly including: a first frame including a plurality of first signal conduits embedded in a first substrate, a second frame including a plurality of second signal conduits embedded in a second substrate, the second frame affixed to the first frame such that an electrical coupling is formed between one or more first signal conduits and one or more of the second signal conduits, and one or more first conductive balls electrically connected to the one or more second signal conduits; forming an assembly by placing a semiconductor die over a first area of a carrier and placing the stacked interconnect pre-assembly over a second area of the carrier such that at least one of the first conductive balls is over the semiconductor die; encapsulating the assembly with a molding compound; exposing a portion of the one or more first conductive balls, the exposed portion providing electrical contact to the stacked interconnect pre-assembly; and removing the carrier to expose a first surface of the semiconductor die and a first surface of the first substrate. Placing the stacked interconnect pre-assembly over a second area may further include positioning an opening formed in the first frame such that the semiconductor die is located within the opening. Providing a stacked interconnect pre-assembly may further include one or more second conductive balls disposed between the first frame and the second frame, electrically coupling the one or more of the first signal conduits with the one or more second signal conduits. The method may further include forming an insulating layer on the exposed surface of the semiconductor die and the first substrate; patterning and etching the insulating layer to expose one or more bond pads on the semiconductor die and to expose conductive surface at a bottom end of the one or more first signal conduits on the first substrate; and forming a conductive layer to electrically connect at least one of the exposed one or more bond pads with at least one of the exposed conductive surfaces. Forming a conductive layer to electrically connect at least one of the exposed one or more bond pads with at least one of the exposed conductive surfaces may provide a conductive path electrically connecting the exposed portion of the one or more first conductive balls with the at least one of the exposed one or more bond pads. The at least one of the first conductive balls over the semiconductor die may be electrically coupled to the at least one of the exposed one or more bond pads via one or more first signal conduits and one or more of the second signal conduits. Exposing a portion of the one or more first conductive balls may include grinding the molding compound to a predetermined depth. Exposing a portion of the one or more first conductive balls may include forming an area sufficient to provide a coupling to a second packaged device attached at a top surface of the packaged semiconductor device. The one or more first conductive balls may include a solder ball.

In another embodiment, there is provided, a method of manufacturing a packaged semiconductor device including providing a stacked interconnect pre-assembly including: a first frame including a plurality of first signal conduits embedded in a first substrate and extending from a first major surface of the first substrate to a second major surface of the first substrate, the first frame having an opening, a second frame including a plurality of second signal conduits embedded in a second substrate and extending from a first major surface of the second substrate to a first interconnect formed on a second major surface of the second substrate, the second frame affixed to the first frame to provide an electrical coupling between the first interconnect and one or more first signal conduits, and one or more first conductive balls electrically coupled to the first interconnect at the second major surface of the second substrate; forming an assembly by placing a semiconductor die over a carrier and placing the stacked interconnect pre-assembly over the semiconductor die and the carrier, the semiconductor die disposed within the opening such that at least one of the one or more first conductive balls is over the semiconductor die; encapsulating the assembly with a molding compound; exposing a portion of the one or more first conductive balls, the exposed portion providing electrical contact to the stacked interconnect pre-assembly; and removing the carrier to expose a first major surface of the semiconductor die and the first major surface of the first substrate. Providing a stacked interconnect pre-assembly may further include one or more second conductive balls disposed between the first frame and the second frame, electrically coupling the one or more of the first signal conduits with the first interconnect. The method may further include forming an insulating layer on the exposed first major surface of the semiconductor die and the first major surface of the first substrate; patterning and etching the insulating layer to expose one or more bond pads on the semiconductor die and to expose conductive surface at a bottom end of the one or more first signal conduits on the first substrate; and forming a conductive layer to electrically connect at least one of the exposed one or more bond pads with at least one of the exposed conductive surfaces. Forming a conductive layer to electrically connect at least one of the exposed one or more bond pads with at least one of the exposed conductive surfaces may provide a conductive path electrically connecting the exposed portion of the one or more first conductive balls with the at least one of the exposed one or more bond pads. The at least one of the first conductive balls over the semiconductor die may be electrically coupled to the at least one of the exposed one or more bond pads via one or more first signal conduits and one or more of the second signal conduits. Exposing a portion of the one or more first conductive balls may include grinding the molding compound to a predetermined depth. Exposing a portion of the one or more first conductive balls may include forming an area sufficient to provide a coupling to a second packaged device attached at a top surface of the packaged semiconductor device. The one or more first conductive balls may include a solder ball.

In yet another embodiment, there is provided, a packaged semiconductor device including a stacked interconnect pre-assembly including: a first frame including a plurality of first signal conduits embedded in a first substrate and extending from a first major surface of the first substrate to a second major surface of the first substrate, the first frame having an opening, a second frame including a plurality of second signal conduits embedded in a second substrate and extending from a first major surface of the second substrate to a first interconnect formed on a second major surface of the second substrate, the second frame affixed to the first frame forming an electrical connection between the first interconnect and one or more first signal conduits, and one or more first conductive balls electrically coupled to the first interconnect at the second major surface of the second substrate; a semiconductor die disposed within the opening of the first frame such that at least one of the first conductive balls is over the semiconductor die; and an encapsulant encapsulating the semiconductor die and the stacked interconnect pre-assembly, the encapsulant having exposed portion of the one or more first conductive balls at a top surface of the encapsulant and exposed portion of one or more bond pads of the semiconductor die at a bottom surface of the encapsulant. The second frame affixed to the first frame may further include one or more second conductive balls disposed between the first frame and the second frame, electrically coupling one or more of the first signal conduits with one or more second signal conduits. The packaged semiconductor device may further include a second interconnect formed below the semiconductor die, the second interconnect to electrically couple the exposed portion of one or more bond pads with one or more of the first signal conduits at the first major surface of the first substrate.

The terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A method of manufacturing a packaged semiconductor device, the method comprising:
   providing a stacked interconnect pre-assembly including:
   a first frame including a plurality of first signal conduits embedded in a first substrate,
   a second frame including a plurality of second signal conduits embedded in a second substrate, the second frame affixed to the first frame such that an electrical coupling is formed between one or more first signal conduits and one or more of the second signal conduits, and
   one or more first conductive balls electrically connected to the one or more second signal conduits;
   forming an assembly by placing a semiconductor die over a first area of a carrier and placing the stacked interconnect pre-assembly over a second area of the carrier such that at least one of the first conductive balls is over the semiconductor die;
   encapsulating the assembly with a molding compound;
   exposing a portion of the one or more first conductive balls, the exposed portion providing electrical contact to the stacked interconnect pre-assembly; and
   removing the carrier to expose a first surface of the semiconductor die and a first surface of the first substrate.

2. The method of claim 1, wherein placing the stacked interconnect pre-assembly over the second area further comprises positioning an opening formed in the first frame such that the semiconductor die is located within the opening.

3. The method of claim 1, wherein the providing the stacked interconnect pre-assembly further comprises one or more second conductive balls disposed between the first frame and the second frame, electrically coupling the one or more of the first signal conduits with the one or more second signal conduits.

4. The method of claim 1, further comprising:
   forming an insulating layer on the exposed first surface of the semiconductor die and the first surface of the first substrate;
   patterning and etching the insulating layer to expose one or more bond pads at the first surface of the semiconductor die and to expose conductive surface at a bottom end of the one or more first signal conduits at the first surface of the first substrate; and
   forming a conductive layer to electrically connect at least one of the exposed one or more bond pads with at least one of the exposed conductive surfaces.

5. The method of claim 4, wherein forming a conductive layer to electrically connect at least one of the exposed one or more bond pads with at least one of the exposed conductive surfaces provides a conductive path electrically connecting the exposed portion of the one or more first conductive balls with the at least one of the exposed one or more bond pads.

6. The method of claim 5, wherein the at least one of the first conductive balls over the semiconductor die is electrically coupled to the at least one of the exposed one or more bond pads via one or more first signal conduits and one or more of the second signal conduits.

7. The method of claim 1, wherein exposing the portion of the one or more first conductive balls comprises grinding the molding compound to a predetermined depth.

8. The method of claim 1, wherein exposing the portion of the one or more first conductive balls comprises forming an area sufficient to provide a coupling to a second packaged device attached at a top surface of the packaged semiconductor device.

9. The method of claim 1, wherein the one or more first conductive balls comprises a solder ball.

10. A method of manufacturing a packaged semiconductor device, the method comprising:
    providing a stacked interconnect pre-assembly including:
    a first frame including a plurality of first signal conduits embedded in a first substrate and extending from a first major surface of the first substrate to a second major surface of the first substrate, the first frame having an opening, a second frame including a plurality of second signal conduits embedded in a second substrate and extending from a first major surface of the second substrate to a first interconnect formed on a second major surface of the second substrate, the second frame affixed to the first frame to provide an electrical coupling between the first interconnect and one or more first signal conduits, and one or more first conductive balls electrically coupled to the first interconnect at the second major surface of the second substrate;

forming an assembly by placing a semiconductor die over a carrier and placing the stacked interconnect pre-assembly over the semiconductor die and the carrier, the semiconductor die disposed within the opening such that at least one of the one or more first conductive balls is over the semiconductor die;

encapsulating the assembly with a molding compound;

exposing a portion of the one or more first conductive balls, the exposed portion providing electrical contact to the stacked interconnect pre-assembly; and removing the carrier to expose a first major surface of the semiconductor die and the first major surface of the first substrate.

11. The method of claim 10, wherein the providing the stacked interconnect pre-assembly further comprises one or more second conductive balls disposed between the first frame and the second frame, electrically coupling the one or more of the first signal conduits with the first interconnect.

12. The method of claim 10, further comprising:

forming an insulating layer on the exposed first major surface of the semiconductor die and the first major surface of the first substrate;

patterning and etching the insulating layer to expose one or more bond pads on the first major surface of the semiconductor die and to expose conductive surface at a bottom end of the one or more first signal conduits on the first major surface of the first substrate; and forming a conductive layer to electrically connect at least one of the exposed one or more bond pads with at least one of the exposed conductive surfaces.

13. The method of claim 12, wherein forming a conductive layer to electrically connect at least one of the exposed one or more bond pads with at least one of the exposed conductive surfaces provides a conductive path electrically connecting the exposed portion of the one or more first conductive balls with the at least one of the exposed one or more bond pads.

14. The method of claim 13, wherein the at least one of the first conductive balls over the semiconductor die is electrically coupled to the at least one of the exposed one or more bond pads via one or more first signal conduits and one or more of the second signal conduits.

15. The method of claim 10, wherein exposing the portion of the one or more first conductive balls comprises grinding the molding compound to a predetermined depth.

16. The method of claim 10, wherein exposing the portion of the one or more first conductive balls comprises forming an area sufficient to provide a coupling to a second packaged device attached at a top surface of the packaged semiconductor device.

17. The method of claim 10, wherein the one or more first conductive balls comprises a solder ball.

18. A packaged semiconductor device comprising:

a stacked interconnect pre-assembly including:

a first frame including a plurality of first signal conduits embedded in a first substrate and extending from a first major surface of the first substrate to a second major surface of the first substrate, the first frame having an opening, a second frame including a plurality of second signal conduits embedded in a second substrate and extending from a first major surface of the second substrate to a first interconnect formed on a second major surface of the second substrate, the second frame affixed to the first frame forming an electrical connection between the first interconnect and one or more first signal conduits, and one or more first conductive balls electrically coupled to the first interconnect at the second major surface of the second substrate;

a semiconductor die disposed within the opening of the first frame such that at least one of the first conductive balls is over the semiconductor die; and an encapsulant encapsulating the semiconductor die and the stacked interconnect pre-assembly, the encapsulant having exposed portion of the one or more first conductive balls at a top surface of the encapsulant and exposed portion of one or more bond pads of the semiconductor die at a bottom surface of the encapsulant.

19. The packaged semiconductor device of claim 18, wherein the second frame affixed to the first frame further comprises one or more second conductive balls disposed between the first frame and the second frame, electrically coupling one or more of the first signal conduits with one or more second signal conduits.

20. The packaged semiconductor device of claim 18, further comprising a second interconnect formed below the semiconductor die, the second interconnect to electrically couple the exposed portion of the one or more bond pads of the semiconductor die with one or more of the first signal conduits at the first major surface of the first substrate.

* * * * *